United States Patent
Ikushima et al.

(10) Patent No.: US 12,172,540 B2
(45) Date of Patent: Dec. 24, 2024

(54) STATUS DETECTION SYSTEM AND CONNECTION CABLE

(71) Applicant: TOYOTA JIDOSHA KABUSHIKI KAISHA, Aichi-ken (JP)

(72) Inventors: Yoshihiro Ikushima, Okazaki (JP); Yusei Nakamura, Toyota (JP); Rikako Zenibana, Toyota (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 107 days.

(21) Appl. No.: 18/169,215

(22) Filed: Feb. 15, 2023

(65) Prior Publication Data

US 2023/0347772 A1 Nov. 2, 2023

(30) Foreign Application Priority Data

Apr. 27, 2022 (JP) .................. 2022-073426

(51) Int. Cl.
| | |
|---|---|
| *B60L 53/62* | (2019.01) |
| *B60L 53/16* | (2019.01) |
| *B60L 53/18* | (2019.01) |
| *B60L 53/53* | (2019.01) |
| *G01R 31/66* | (2020.01) |

(52) U.S. Cl.
CPC .............. *B60L 53/62* (2019.02); *B60L 53/16* (2019.02); *B60L 53/18* (2019.02); *B60L 53/53* (2019.02); *G01R 31/66* (2020.01); *B60L 2200/28* (2013.01)

(58) Field of Classification Search
CPC .......... B60L 53/62; B60L 53/16; B60L 53/18; B60L 53/53; B60L 2200/28; B60L 3/12; B60L 50/60; G01R 31/66; G01R 31/006; G01R 31/58; Y02T 90/14; Y02T 10/70; Y02T 10/7072; B60D 1/24; B60D 1/62; H01R 13/02
See application file for complete search history.

(56) References Cited

U.S. PATENT DOCUMENTS

| | | | |
|---|---|---|---|
| 2021/0008994 A1 | 1/2021 | Choi et al. | |
| 2023/0030477 A1* | 2/2023 | Sato ....................... | B60L 3/0046 |
| 2023/0100938 A1* | 3/2023 | Kinomura ............... | B60L 53/35 |
| | | | 320/109 |
| 2023/0322113 A1* | 10/2023 | Kanda ..................... | B60L 53/67 |
| | | | 320/109 |

FOREIGN PATENT DOCUMENTS

JP    2013246701 A    12/2013

* cited by examiner

*Primary Examiner* — Giovanni Astacio-Oquendo
*Assistant Examiner* — Zannatul Ferdous
(74) *Attorney, Agent, or Firm* — HAUPTMAN HAM, LLP

(57) ABSTRACT

A status detection system includes a connection cable, a first detection unit, a second detection unit, and a determination unit configured to make determination on an overall connection status among a power storage vehicle, an electrified vehicle, and the connection cable based on a detection result from the first detection unit and a detection result from the second detection unit.

7 Claims, 5 Drawing Sheets

FIG. 4

| DETECTION STATUS | POWER SUPPLY SYSTEM | | CONNECTION DETECTION SYSTEM | | |
|---|---|---|---|---|---|
| | + | − | ELECTRIFIED VEHICLE TERMINAL | CHARGER TERMINAL | TRAILER TERMINAL |
| ELECTRIFIED VEHICLE CONNECTION | ○ | ○ | ○ | × | × |
| CHARGER CONNECTION | ○ | ○ | × | ○ | × |
| BATTERY TRAILER CONNECTION | ○ | ○ | × | × | ○ |
| UNCONNECTED | × | × | × | × | × |
| FAILURE | ○ or × | ○ or × | DETECTION OF CONNECTION OTHER THAN ABOVE | | |
| | ○ | ○ | × | × | × |

STATUS DETECTION SYSTEM AND CONNECTION CABLE

CROSS-REFERENCE TO RELATED APPLICATION

This application claims priority to Japanese Patent Application No. 2022-073426 filed on Apr. 27, 2022, incorporated herein by reference in its entirety.

BACKGROUND

1. Technical Field

The present disclosure relates to a status detection system and a connection cable.

2. Description of Related Art

Japanese Unexamined Patent Application Publication No. 2013-246701 (JP 2013-246701 A) discloses a battery trailer system including a server, a battery electric vehicle, and a battery trailer detachably connected to the battery electric vehicle. The battery trailer transmits, to the server, connection status information including information on, for example, an error in the connection to the battery electric vehicle.

SUMMARY

JP 2013-246701 A discloses that the battery electric vehicle is supplied with electric power from one battery trailer alone. However, no consideration is given to a case where the operating battery electric vehicle is supplied with electric power from a plurality of battery trailers. For example, when connecting a plurality of battery trailers to the operating battery electric vehicle, a connection status detection system and connection cables unlike those in the related art are conceivable.

The present disclosure provides a status detection system and a connection cable unlike those in the related art.

A status detection system according to a first aspect of the present disclosure is configured to detect a connection status among a power storage vehicle, an electrified vehicle, and a connection cable. The status detection system includes: the connection cable electrically connectable to the electrified vehicle or the power storage vehicle; a first detection unit configured to detect an electrical connection status between the electrified vehicle and the connection cable; a second detection unit configured to detect an electrical connection status between the power storage vehicle and the connection cable; and a determination unit configured to make determination on an overall connection status among the power storage vehicle, the electrified vehicle, and the connection cable based on the electrical connection status between the electrified vehicle and the connection cable based on a detection result from the first detection unit and the electrical connection status between the power storage vehicle and the connection cable based on a detection result from the second detection unit.

Such a configuration includes the first detection unit configured to detect the electrical connection status between the electrified vehicle and the connection cable, and the second detection unit configured to detect the electrical connection status between the power storage vehicle and the connection cable. The determination unit makes determination on the overall connection status among the power storage vehicle, the electrified vehicle, and the connection cable based on the detection results from the first detection unit and the second detection unit. Accordingly, the determination unit can make determination on the connection status of the connection cable that connects the electrified vehicle and the power storage vehicle based on the detection results from the first detection unit and the second detection unit. Further, the determination unit can make determination on the connection status of the connection cable that connects the power storage vehicles based on the detection result from the second detection unit.

In the status detection system according to the first aspect, the connection cable may include a cable portion, a first connector provided at a first end of the cable portion, and a second connector provided at a second end of the cable portion. Each of the first connector and the second connector may include a first terminal configured to be connected to an electrified vehicle-side identification terminal provided to the electrified vehicle and not to be connected to a power storage vehicle-side identification terminal provided to the power storage vehicle, and a second terminal configured to be connected to the power storage vehicle-side identification terminal and not to be connected to the electrified vehicle-side identification terminal.

The first detection unit may be configured to detect the electrical connection status between the electrified vehicle and the connection cable based on an electrical status of the first terminal. The second detection unit may be configured to detect the electrical connection status between the power storage vehicle and the connection cable based on an electrical status of the second terminal.

According to such a configuration, the first detection unit can easily detect the electrical connection status between the electrified vehicle and the connection cable by detecting the electrical status of the first terminal. The second detection unit can easily detect the electrical connection status between the power storage vehicle and the connection cable by detecting the electrical status of the second terminal.

In the status detection system according to the first aspect, the first terminal and the second terminal may be disposed in each of the first connector and the second connector so as not to overlap each other in a front view on a connection plane of each of the first connector and the second connector.

The status detection system according to the first aspect may further include a third detection unit configured to detect an electrical connection status between the connection cable and an external charger. The connection cable may be electrically connectable to the external charger. The determination unit may be configured to make determination on an overall connection status between the external charger and the connection cable based on the electrical connection status between the external charger and the connection cable based on a detection result from the third detection unit.

According to such a configuration, the determination unit can make determination on the connection status of the connection cable that connects the power storage vehicle and the external charger based on the detection result from the third detection unit.

In the status detection system according to the first aspect, the connection cable may include a cable portion, a first connector provided at a first end of the cable portion, and a second connector provided at a second end of the cable portion.

Each of the first connector and the second connector may include a third terminal configured to be connected to a charger-side identification terminal provided to the external charger. The third detection unit may be configured to detect the electrical connection status between the external charger and the connection cable based on an electrical status of the third terminal.

According to such a configuration, the third detection unit can easily detect the electrical connection status between the external charger and the connection cable by detecting the electrical status of the third terminal.

In the status detection system according to the first aspect, the third terminal may be configured not to be connected to an electrified vehicle-side identification terminal and a power storage vehicle-side identification terminal.

A connection cable according to a second aspect of the present disclosure is configured to electrically connect a power storage vehicle and an electrified vehicle and to electrically connect power storage vehicles.

The connection cable includes a first detection unit configured to detect an electrical connection status between the electrified vehicle and the connection cable, and a second detection unit configured to detect an electrical connection status between the power storage vehicle and the connection cable.

According to such a configuration, it is possible to more reliably detect the connection status between the electrified vehicle and the first power storage vehicle based on the detection results from the first detection unit and the second detection unit. Further, it is possible to more reliably detect the connection status between the first power storage vehicle and the second power storage vehicle based on the detection result from the second detection unit.

In the connection cable according to the second aspect, the connection cable may be configured to electrically connect the power storage vehicle and an external charger, and the connection cable may further include a third detection unit configured to detect an electrical connection status between the external charger and the connection cable. According to such a configuration, it is possible to more reliably detect the connection status between the power storage vehicle and the external charger based on the detection result from the third detection unit.

The connection cable according to the second aspect may further include: a first terminal configured to be connected to an electrified vehicle-side identification terminal provided to the electrified vehicle and not to be connected to a power storage vehicle-side identification terminal provided to the power storage vehicle; and a second terminal configured to be connected to the power storage vehicle-side identification terminal and not to be connected to the electrified vehicle-side identification terminal.

The first detection unit may include a first sensor configured to detect an energization amount of the first terminal, and may be configured to detect the electrical connection status between the electrified vehicle and the connection cable based on the energization amount detected by the first sensor. The second detection unit may include a second sensor configured to detect an energization amount of the second terminal, and may be configured to detect the electrical connection status between the power storage vehicle and the connection cable based on the energization amount detected by the second sensor.

According to the present disclosure, it is possible to more reliably detect the connection status among the electrified vehicle, the power storage vehicle, and the connection cable.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 4 is a diagram showing a relationship between a status of each terminal of the connector and a status of the connector (connection status)

DETAILED DESCRIPTION OF EMBODIMENTS

An embodiment of the present disclosure will be described in detail below with reference to the drawings. The same or corresponding parts are denoted by the same signs throughout the drawings, and description thereof will not be repeated.

Figure 1:
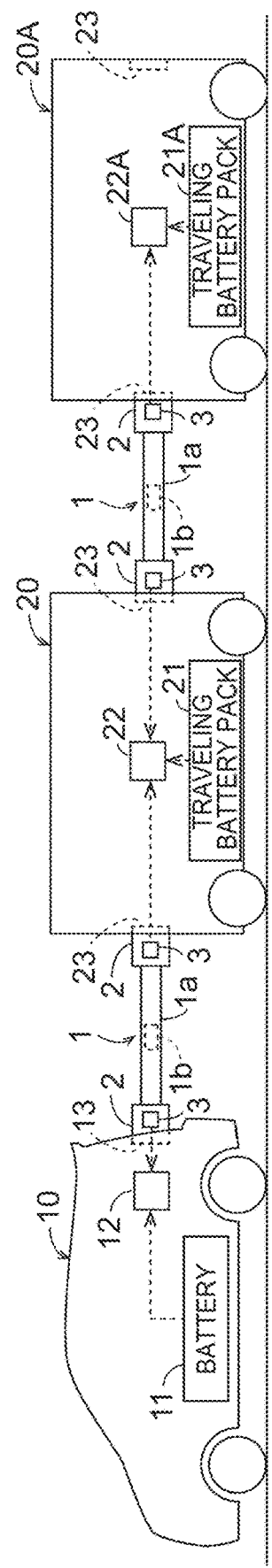
FIG. 1 is a diagram showing an example of the configuration of a status detection system according to one embodiment.

FIG. 1 is a diagram showing the configuration of a status detection system 100 according to the present embodiment. FIG. 1 shows, as an example, the status detection system 100 in a state in which one electrified vehicle 10 and two battery trailers 20 are connected.

As shown in FIG. 1, the status detection system 100 includes a plurality of (two in FIG. 1) connection cables 1. One connection cable 1 electrically and physically connects the electrified vehicle 10 and the battery trailer 20. The other connection cable 1 electrically and physically connects the two battery trailers 20. In FIG. 1 and the following description, the rear battery trailer 20 is referred to as "battery trailer 20A" as appropriate for the description. The battery trailer 20 is an example of a "power storage vehicle" of the present disclosure.

The electrified vehicle 10 is a vehicle for cargo handling and transportation. The electrified vehicle 10 includes a battery 11, a battery controller 12, and a terminal unit 13 (see FIG. 3B). The electrified vehicle 10 uses electric power in the battery 11 to perform operations such as traveling and cargo handling and transportation. The battery controller 12 manages, for example, the status of electric power (voltage and current) and the temperature of the battery 11. A connector 2 (described later) of the connection cable 1 is connected to the terminal unit 13. The battery controller 12 is an example of a "first detection unit" of the present disclosure.

Figure 3A:
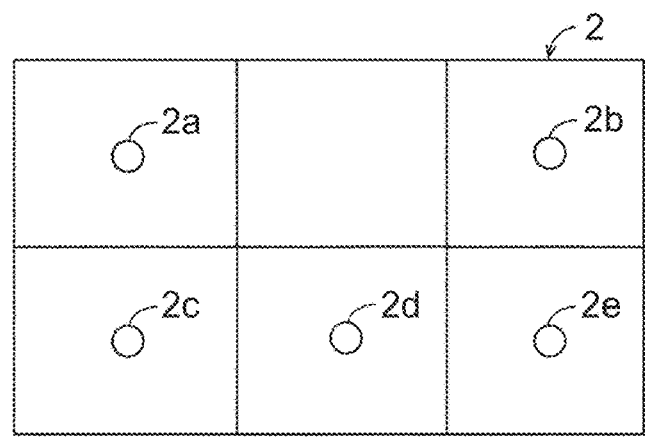
FIG. 3A is a front view on a connection plane of a connector, showing a terminal structure of the connector.
Figure 3B:
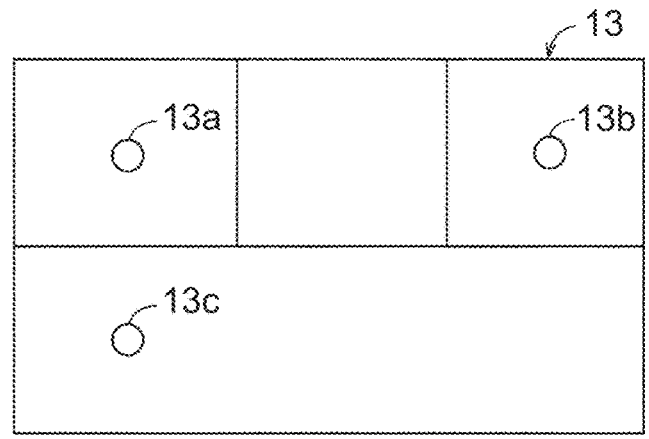
FIG. 3B is a diagram showing a terminal structure of the electrified vehicle.
Figure 3C:
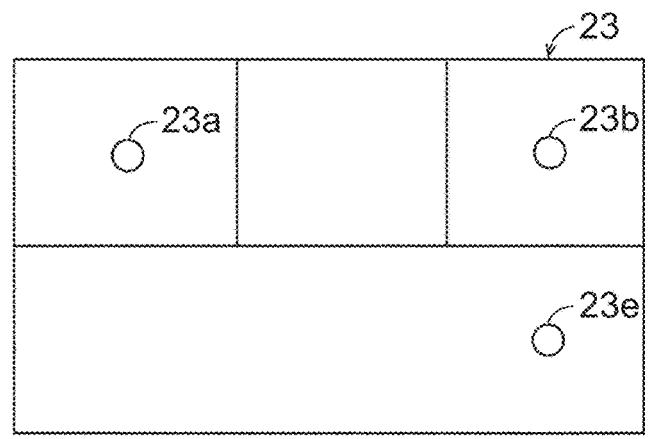
FIG. 3C is a diagram showing a terminal structure of the battery trailer.

The battery trailer 20 includes a traveling battery pack 21, a battery controller 22, and a terminal unit 23 (see FIG. 3C). The battery trailer 20 supplies electric power in the traveling battery pack 21 to the electrified vehicle 10 via the connection cable 1 during cargo handling work performed by the electrified vehicle 10. The battery controller 22 manages, for example, the status of electric power (voltage and current)

and the temperature of the traveling battery pack 21. The battery controller 22 is an example of a "second detection unit" of the present disclosure.

A connector 2 (described later) of the connection cable 1 is connected to the terminal unit 23. The terminal unit 23 is provided on each of the front side and the rear side of the battery trailer 20. Therefore, the battery trailer 20 is configured such that the connection cable 1 can be connected to each of the front side and the rear side.

A traveling battery pack 21A and a battery controller 22A of the battery trailer 20A have the same configurations as those of the traveling battery pack 21 and the battery controller 22, respectively. The battery trailer 20A supplies electric power in the traveling battery pack 21A to the electrified vehicle 10 via the connection cable 1 during cargo handling work performed by the electrified vehicle 10. Although illustration is omitted, the battery trailer 20A includes a terminal unit having the same configuration as that of the terminal unit 23 of the battery trailer 20.

The capacity of the traveling battery pack 21 of the battery trailer 20 is larger than the capacity of the battery 11 of the electrified vehicle 10. Thus, the operable period of the electrified vehicle 10 can easily be extended (for example, twice or more) by the electric power in the traveling battery pack 21.

The connection cable 1 includes a cable portion 1a and a pair of connectors 2 each provided at corresponding one of ends of the cable portion 1a. The cable portion 1a includes a controller 1b. Each of the connectors 2 includes a sensor 3 for detecting, for example, a current value or a voltage value of each terminal (2a to 2e) of the connector 2. The sensor 3 is an example of the "first detection unit", the "second detection unit", and a "third detection unit" of the present disclosure. The controller 1b is an example of a "determination unit" of the present disclosure.

The connection cable 1 is electrically connected to the electrified vehicle 10 by connecting the connector 2 to the terminal unit 13 (see FIG. 3B) of the electrified vehicle 10. The connection cable 1 is electrically connected to the battery trailer 20 by connecting the connector 2 to the terminal unit 23 (see FIG. 3C) of the battery trailer 20.

Figure 2A:
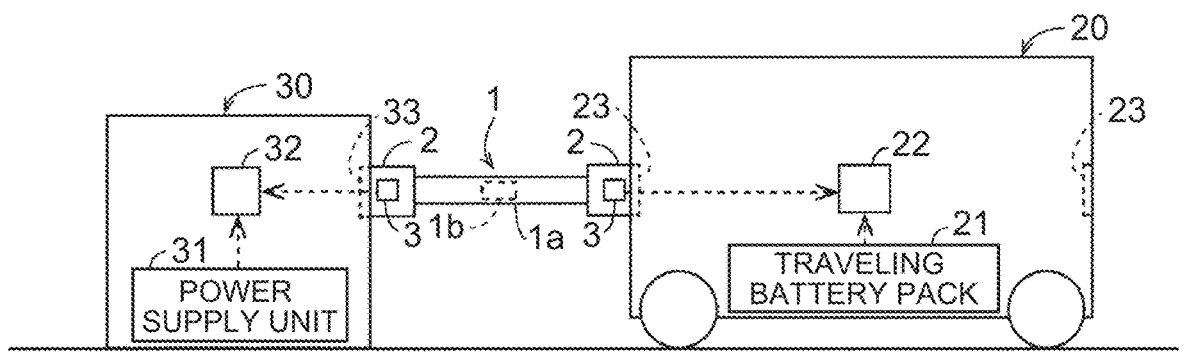
FIG. 2A is a diagram showing a state in which an external charger and a battery trailer are connected by a connection cable.

As shown in FIG. 2A, the connection cable 1 is electrically connected to an external charger 30 by connecting the connector 2 to the external charger 30. Thus, the connection cable 1 can electrically connect the external charger 30 and the battery trailer 20.

Figure 2B:
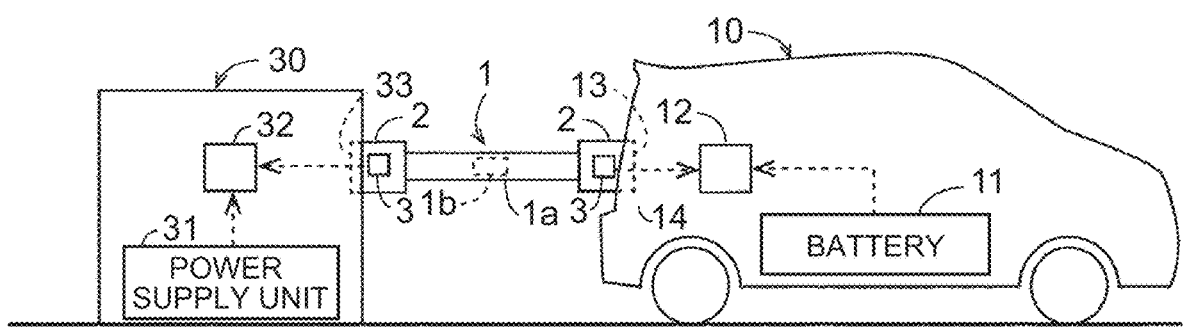
FIG. 2B is a diagram showing a state in which the external charger and an electrified vehicle are connected by the connection cable.

As shown in FIG. 2B, the connection cable 1 can also electrically connect the external charger 30 and the electrified vehicle 10.

Figure 3D:
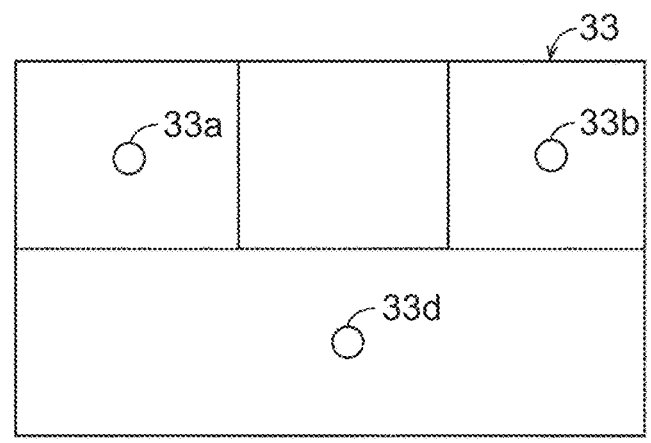
FIG. 3D is a diagram showing a terminal structure of the external charger.

The external charger 30 includes a power supply unit 31, a power supply controller 32, and a terminal unit 33 (see FIG. 3D). The external charger 30 charges the battery trailer 20 and the electrified vehicle 10 with electric power from the power supply unit 31. The power supply controller 32 manages, for example, the status of electric power (voltage and current) and the temperature of the power supply unit 31. The connector 2 of the connection cable 1 is connected to the terminal unit 33. The power supply controller 32 is an example of the "third detection unit" of the present disclosure.

FIG. 3A is a front view on a connection place of the connector 2, showing a terminal structure of the connector 2. As shown in FIG. 3A, the connector 2 includes a positive terminal 2a, a negative terminal 2b, an electrified vehicle terminal 2c, a charger terminal 2d, and a trailer terminal 2e. These terminals (2a to 2e) are disposed so as not to overlap each other in the front view on the connection place of the connector 2. In the present embodiment, the terminals (2a to 2e) are disposed, for example, in a grid pattern (matrix pattern). The disposition of the terminals (2a to 2e) is not limited to this example. The electrified vehicle terminal 2c and the charger terminal 2d are examples of a "first terminal" and a "third terminal" of the present disclosure, respectively. The trailer terminal 2e is an example of a "second terminal" of the present disclosure.

The positive terminal 2a and the negative terminal 2b are power supply terminals. The electrified vehicle terminal 2c is a terminal for electrically connecting the connection cable 1 and the electrified vehicle 10. The trailer terminal 2e is a terminal for electrically connecting the connection cable 1 and the battery trailer 20. The charger terminal 2d is a terminal for electrically connecting the connection cable 1 and the external charger 30.

As shown in FIG. 3B, the terminal unit 13 of the electrified vehicle 10 includes a positive terminal 13a, a negative terminal 13b, and a terminal 13c. The positive terminal 13a, the negative terminal 13b, and the terminal 13c are connected to the positive terminal 2a, the negative terminal 2b, and the electrified vehicle terminal 2c of the connector 2, respectively. The terminal 13c is an example of an "electrified vehicle-side identification terminal" of the present disclosure.

As shown in FIG. 3C, the terminal unit 23 of the battery trailer 20 includes a positive terminal 23a, a negative terminal 23b, and a terminal 23e. The positive terminal 23a, the negative terminal 23b, and the terminal 23e are connected to the positive terminal 2a, the negative terminal 2b, and the trailer terminal 2e of the connector 2, respectively. The terminal 23e is an example of a "power storage vehicle-side identification terminal" of the present disclosure.

As shown in FIG. 3D, the terminal unit 33 of the external charger 30 includes a positive terminal 33a, a negative terminal 33b, and a terminal 33d. The positive terminal 33a, the negative terminal 33b, and the terminal 33d are connected to the positive terminal 2a, the negative terminal 2b, and the charger terminal 2d of the connector 2, respectively. The terminal 33d is an example of a "charger-side identification terminal" of the present disclosure.

The battery controller 12 of the electrified vehicle 10 acquires a detection value of the sensor 3 of the connector 2 connected to the electrified vehicle 10. When the battery controller 12 detects, based on the acquired detection value, that the positive terminal 2a, the negative terminal 2b, and the electrified vehicle terminal 2c are in a conductive state (see "o" in FIG. 4) and the trailer terminal 2e and the charger terminal 2d are in a non-conductive state (see "x" in FIG. 4) (see an "electrified vehicle connection" section in FIG. 4), the battery controller 12 determines that the electrified vehicle 10 and the connection cable 1 are connected properly. The battery controller 12 determines that the electrified vehicle 10 and the connection cable 1 are not connected properly in cases other than the above.

The battery controller 22 of the battery trailer 20 acquires a detection value of the sensor 3 of the connector 2 connected to the battery trailer 20. When the battery controller 22 detects, based on the acquired detection value, that the positive terminal 2a, the negative terminal 2b, and the trailer terminal 2e are in the conductive state and the electrified vehicle terminal 2c and the charger terminal 2d are in the non-conductive state (see a "battery trailer connection" section in FIG. 4), the battery controller 22 determines that the battery trailer 20 and the connection cable 1 are connected properly. The battery controller 22 determines that the battery trailer 20 and the connection cable 1 are not connected properly in cases other than the above.

The power supply controller 32 of the external charger 30 acquires a detection value of the sensor 3 of the connector 2 connected to the external charger 30. When the power supply controller 32 detects, based on the acquired detection value, that the positive terminal 2a, the negative terminal 2b, and the charger terminal 2d are in the conductive state and the electrified vehicle terminal 2c and the trailer terminal 2e are in the non-conductive state (see a "charger connection" section in FIG. 4), the power supply controller 32 determines that the external charger 30 and the connection cable 1 are connected properly. The power supply controller 32 determines that the external charger 30 and the connection cable 1 are not connected properly in cases other than the above.

When the battery controller 12 (battery controller 22, power supply controller 32) detects that the positive terminal 2a, the negative terminal 2b, the electrified vehicle terminal 2c, the trailer terminal 2e, and the charger terminal 2d are in the non-conductive state (see an "unconnected" section in FIG. 4), the battery controller 12 (battery controller 22, power supply controller 32) determines that the connector 2 is unconnected. When the battery controller 12 (battery controller 22, power supply controller 32) detects that two or more of the electrified vehicle terminal 2c, the trailer terminal 2e, and the charger terminal 2d are in the conductive state (see an upper part of a "failure" section in FIG. 4), the battery controller 12 (battery controller 22, power supply controller 32) determines that the connector 2 has failed. When the battery controller 12 (battery controller 22, power supply controller 32) detects that the positive terminal 2a and the negative terminal 2b are in the conductive state but the electrified vehicle terminal 2c, the trailer terminal 2e, and the charger terminal 2d are in the non-conductive state (see a lower part of the "failure" section in FIG. 4), the battery controller 12 (battery controller 22, power supply controller 32) determines that the connector 2 has failed. When the battery controller 12 (battery controller 22, power supply controller 32) determines that the connector 2 has failed (the connector 2 is unconnected), the electrified vehicle 10 (battery trailer 20, external charger 30) may be notified that the connector 2 (connection cable 1) is in the failed (unconnected) state.

In the example shown in FIG. 1, the controller 1b of the connection cable 1 that connects the electrified vehicle 10 and the battery trailer 20 makes determination on the connection status of the connection cable 1 based on the determination results from the battery controller 12 of the electrified vehicle 10 and the battery controller 22 of the battery trailer 20 (examples of a "detection result" of the present disclosure). Specifically, the controller 1b determines that the connection cable 1 properly connects the electrified vehicle 10 and the battery trailer 20 when the battery controller 12 determines that the electrified vehicle 10 and the connection cable 1 are connected properly and the battery controller 22 determines that the battery trailer 20 and the connection cable 1 are connected properly.

The controller 1b determines that the connection cable 1 does not properly connect the electrified vehicle 10 and the battery trailer 20 in at least one of a case where the battery controller 12 determines that the electrified vehicle 10 and the connection cable 1 are not connected properly and a case where the battery controller 22 determines that the battery trailer 20 and the connection cable 1 are not connected properly.

The controller 1b of the connection cable 1 that connects the battery trailers 20 makes determination on the connection status of the connection cable 1 based on the determination results from the battery controllers 22 of the two battery trailers 20 (examples of the "detection result" of the present disclosure). Specifically, the controller 1b determines that the connection cable 1 properly connects the battery trailers 20 when the two battery controllers 22 determine that the battery trailers 20 and the connection cable 1 are connected properly.

Specifically, the controller 1b determines that the connection cable 1 does not properly connect the battery trailers 20 when at least one of the two battery controllers 22 determines that the battery trailer 20 and the connection cable 1 are not connected properly.

In the example shown in FIG. 2A, the controller 1b of the connection cable 1 that connects the battery trailer 20 and the external charger 30 makes determination on the connection status of the connection cable 1 based on the determination results from the battery controller 22 of the battery trailer 20 and the power supply controller 32 of the external charger 30 (examples of the "detection result" of the present disclosure). Specifically, the controller 1b determines that the connection cable 1 properly connects the battery trailer 20 and the external charger 30 when the battery controller 22 determines that the battery trailer 20 and the connection cable 1 are connected properly and the power supply controller 32 determines that the external charger 30 and the connection cable 1 are connected properly.

The controller 1b determines that the connection cable 1 does not properly connect the battery trailer 20 and the external charger 30 in at least one of a case where the battery controller 22 determines that the battery trailer 20 and the connection cable 1 are not connected properly and a case where the power supply controller 32 determines that the external charger 30 and the connection cable 1 are not connected properly.

In the example shown in FIG. 2B, the controller 1b of the connection cable 1 that connects the electrified vehicle 10 and the external charger 30 makes determination on the connection status of the connection cable 1 based on the determination results from the battery controller 12 of the electrified vehicle 10 and the power supply controller 32 of the external charger 30 (examples of the "detection result" of the present disclosure). Specifically, the controller 1b determines that the connection cable 1 properly connects the electrified vehicle 10 and the external charger 30 when the battery controller 12 determines that the electrified vehicle 10 and the connection cable 1 are connected properly and the power supply controller 32 determines that the external charger 30 and the connection cable 1 are connected properly.

The controller 1b determines that the connection cable 1 does not properly connect the electrified vehicle 10 and the external charger 30 in at least one of a case where the battery controller 12 determines that the electrified vehicle 10 and the connection cable 1 are not connected properly and a case where the power supply controller 32 determines that the external charger 30 and the connection cable 1 are not connected properly.

The controller 1b enables power transfer via the connection cable 1 when determination is made that the connection via the connection cable 1 is normal. Specifically, when the controller 1b determines that the connection via the connection cable 1 is normal, the controller 1b controls a relay (not shown) provided in the connection cable 1 (system main relay) to terminate the state in which the power transfer is interrupted. When the controller 1b determines that the connection via the connection cable 1 is not normal, the controller 1b keeps the state in which the power transfer is interrupted without controlling the relay.

As described above, in the present embodiment, the controller 1b makes determination on the connection status of the connection cable 1 based on the determination results from the battery controller 12 and the battery controller 22. Therefore, electric power can be transferred through the connection cable 1 in a state in which the controller 1b confirms that the connection cable 1 properly connects the electrified vehicle 10 and the battery trailer 20. Further, electric power can be transferred through the connection cable 1 in a state in which the controller 1b confirms that the connection cable 1 properly connects the battery trailers 20. As a result, electric power can be supplied from each of the battery trailers 20 to the electrified vehicle 10 while the electrified vehicle 10 and the battery trailers 20 are connected by the connection cables 1. Thus, the traveling (operation) period of the electrified vehicle 10 can be extended easily.

Further, common connection cables can be used as the connection cable 1 that connects the electrified vehicle 10 and the battery trailer 20 and the connection cable 1 that connects the battery trailers 20. As a result, the number of types of components can be reduced.

Figure 5:
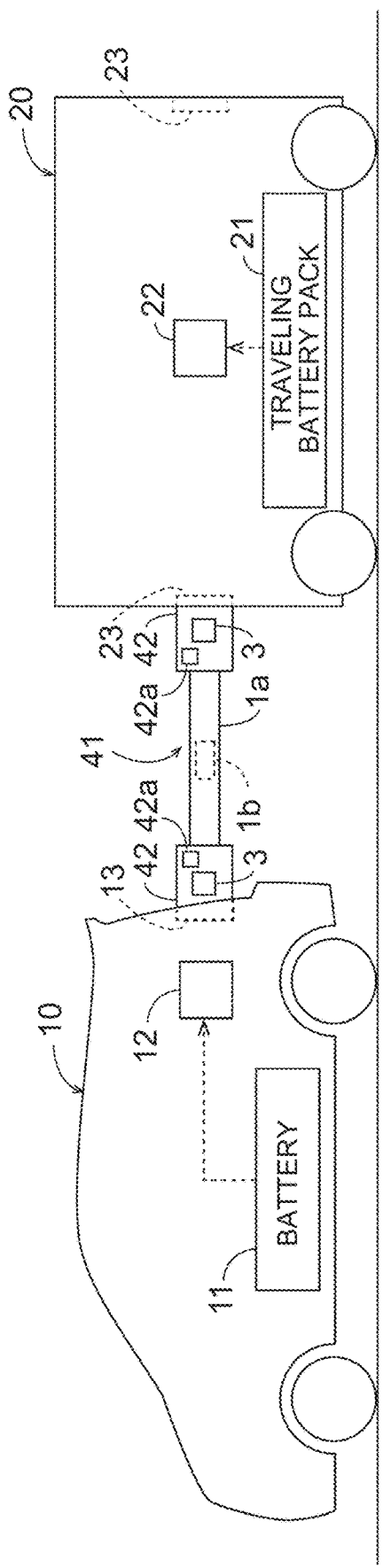
FIG. 5 is a diagram showing an example of the configuration of a status detection system according to a modification of the embodiment.

The above embodiment is directed to the example in which the controller (12, 22, 32) of each vehicle (charger) that acquires the detection value of the sensor 3 determines whether the connection of the connector 2 is normal. The present disclosure is not limited to this example. As shown in FIG. 5, a connector 42 may include a controller 42a that makes the above determination. In this case, the controller 1b of a connection cable 41 determines whether the connection of the connection cable 41 is normal based on the determination of the controller 42a of each of a pair of connectors 42. The controller 42a is an example of the "first detection unit", the "second detection unit", and the "third detection unit" of the present disclosure.

The above embodiment is directed to the example in which the controller 1b provided in the connection cable 1 determines whether the connection status of the connection cable 1 is normal. The present disclosure is not limited to this example. For example, at least one of the battery controller 12 of the electrified vehicle 10, the battery controller 22 of the battery trailer 20, and the power supply controller 32 of the external charger 30 may determine whether the connection status of the connection cable 1 is normal. A server may be provided separately from the connection cable 1, the electrified vehicle 10, the battery trailer 20, and the external charger 30 to determine whether the connection status of the connection cable 1 is normal. In this case, the server may acquire information about the connection status of each connector 2 through communication.

The above embodiment is directed to the example in which each of the battery controller 12 that manages the battery 11, the battery controller 22 that manages the traveling battery pack 21, and the power supply controller 32 that manages the power supply unit 31 makes determination on (detects) the connection status of the connector 2. The 5 present disclosure is not limited to this example. In the electrified vehicle 10 (battery trailer 20, external charger 30), a controller dedicated to the determination (detection) may be provided separately from the battery controller 12 (battery controller 22, power supply controller 32).

The configurations described in the above embodiment and the various 10 modifications described above may be combined as desired.

The embodiment disclosed herein shall be construed as illustrative and not restrictive in all respects. The scope of the present disclosure is shown by the claims rather than by the above description of the embodiment, and is intended to include all modifications within the meaning and scope equivalent to those of the claims.

What is claimed is:

1. A status detection system configured to detect a connection status among a power storage vehicle, an electrified vehicle, and a connection cable, the status detection system comprising:
   the connection cable electrically connectable to the electrified vehicle or the power storage vehicle;
   a first detection unit configured to detect an electrical connection status between the electrified vehicle and the connection cable;
   a second detection unit configured to detect an electrical connection status between the power storage vehicle and the connection cable; and
   a determination unit configured to make determination on an overall connection status among the power storage vehicle, the electrified vehicle, and the connection cable based on the electrical connection status between the electrified vehicle and the connection cable based on a detection result from the first detection unit and the electrical connection status between the power storage vehicle and the connection cable based on a detection result from the second detection unit(,)
   wherein: the connection cable includes a cable portion, a first connector provided at a first end of the cable portion, and a second connector provided at a second end of the cable portion, each of the first connector and the second connector including a first terminal configured to be connected to an electrified vehicle-side identification terminal provided to the electrified vehicle and not to be connected to a power storage vehicle-side identification terminal provided to the power storage vehicle, and a second terminal configured to be connected to the power storage vehicle-side identification terminal and not to be connected to the electrified vehicle-side identification terminal;
   the first detection unit is configured to detect the electrical connection status between the electrified vehicle and the connection cable based on an electrical status of the first terminal; and
   the second detection unit is configured to detect the electrical connection status between the power storage vehicle and the connection cable based on an electrical status of the second terminal.

2. The status detection system according to claim 1, wherein the first terminal and the second terminal are disposed in each of the first connector and the second connector so as not to overlap each other in a front view on a connection plane of each of the first connector and the second connector.

3. The status detection system according to claim 1, further comprising a third detection unit configured to detect an electrical connection status between the connection cable and an external charger, wherein:
   the connection cable is electrically connectable to the external charger; and
   the determination unit is configured to make determination on an overall connection status between the external charger and the connection cable based on the electrical connection status between the external charger and the connection cable based on a detection result from the third detection unit.

4. The status detection system according to claim 3, wherein:
the connection cable includes a cable portion, a first connector provided at a first end of the cable portion, and a second connector provided at a second end of the cable portion, each of the first connector and the second connector including a third terminal configured to be connected to a charger-side identification terminal provided to the external charger; and
the third detection unit is configured to detect the electrical connection status between the external charger and the connection cable based on an electrical status of the third terminal.

5. The status detection system according to claim 4, wherein the third terminal is configured not to be connected to an electrified vehicle-side identification terminal and a power storage vehicle-side identification terminal.

6. A connection cable configured to electrically connect a power storage vehicle and an electrified vehicle and to electrically connect power storage vehicles, the connection cable comprising:
a first detection unit configured to detect an electrical connection status between the electrified vehicle and the connection cable; and
a second detection unit configured to detect an electrical connection status between the power storage vehicle and the connection cable (,)
further comprising: a first terminal configured to be connected to an electrified vehicle-side identification terminal provided to the electrified vehicle and not to be connected to a power storage vehicle-side identification terminal provided to the power storage vehicle; and
a second terminal configured to be connected to the power storage vehicle-side identification terminal and not to be connected to the electrified vehicle-side identification terminal, wherein:
the first detection unit includes a first sensor configured to detect an energization amount of the first terminal, and is configured to detect the electrical connection status between the electrified vehicle and the connection cable based on the energization amount detected by the first sensor; and the second detection unit includes a second sensor configured to detect an energization amount of the second terminal, and is configured to detect the electrical connection status between the power storage vehicle and the connection cable based on the energization amount detected by the second sensor.

7. The connection cable according to claim 6, wherein:
the connection cable is configured to electrically connect the power storage vehicle and an external charger; and
the connection cable further includes a third detection unit configured to detect an electrical connection status between the external charger and the connection cable.

* * * * *